United States Patent
Grodzki

(10) Patent No.: US 9,910,120 B2
(45) Date of Patent: Mar. 6, 2018

(54) METHOD AND MAGNETIC RESONANCE APPARATUS TO ACQUIRE MAGNETIC RESONANCE DATA WITH A DIFFUSION-WEIGHTED MAGNETIC RESONANCE SEQUENCE

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 606 days.

(21) Appl. No.: 14/527,047

(22) Filed: Oct. 29, 2014

(65) Prior Publication Data

US 2015/0115960 A1    Apr. 30, 2015

(30) Foreign Application Priority Data

Oct. 29, 2013 (DE) .................... 10 2013 221 938

(51) Int. Cl.
| | | |
|---|---|---|
| *G01R 33/561* | (2006.01) | |
| *G01R 33/34* | (2006.01) | |
| *G01R 33/50* | (2006.01) | |
| *G01R 33/563* | (2006.01) | |

(52) U.S. Cl.
CPC ........... *G01R 33/561* (2013.01); *G01R 33/34* (2013.01); *G01R 33/50* (2013.01); *G01R 33/56341* (2013.01)

(58) Field of Classification Search
CPC   G01R 33/561; G01R 33/56341; G01R 33/34; G01R 33/50
See application file for complete search history.

(56) References Cited

U.S. PATENT DOCUMENTS

| | | | |
|---|---|---|---|
| 6,188,922 B1 | 2/2001 | Mistretta et al. | |
| 6,198,289 B1 * | 3/2001 | Du | ........................ G01R 33/385 324/307 |
| 7,205,763 B2 | 4/2007 | Porter | |
| 2002/0053906 A1 | 5/2002 | Yamazaki | |
| 2005/0007112 A1 | 1/2005 | Deimling | |
| 2005/0237057 A1 * | 10/2005 | Porter | .............. G01R 33/56341 324/307 |

(Continued)

FOREIGN PATENT DOCUMENTS

| | | |
|---|---|---|
| CN | 102768347 A | 11/2012 |
| JP | H11262478 A | 9/1999 |

OTHER PUBLICATIONS

Machine translation of JP-H11-262478 date Sep. 28, 1999.*

(Continued)

*Primary Examiner* — G. M. Hyder
(74) *Attorney, Agent, or Firm* — Schiff Hardin LLP

(57) ABSTRACT

In a method and magnetic resonance apparatus to acquire magnetic resonance data with a diffusion-weighted magnetic resonance sequence wherein the magnetic resonance apparatus as a gradient coil arrangement with three gradient coils designed to generate a gradient in gradient directions orthogonal to one another, the readout gradient is flipped relative to at least one of the gradient directions such that at least two gradient coils contribute to a possible slew rate of a readout gradient pulse, and such that a phase coding gradient that is constant over the readout time period is selected.

20 Claims, 4 Drawing Sheets

(56) References Cited

U.S. PATENT DOCUMENTS

2010/0033179 A1    2/2010  Hargreaves et al.
2011/0298458 A1*  12/2011  Ookawa ................ A61B 5/055
                                                            324/309
2013/0335080 A1   12/2013  Jo et al.
2014/0084916 A1    3/2014  Greiser et al.

OTHER PUBLICATIONS

Yan, et al. "Phase Angle Tilting (PAT) for Distortion Correction Caused by Susceptibility in EPI" in Proc. Intl. Soc. Mag. Reson. Med., vol. 17; pp. 2782; (2009).

"High Resolution Diffusion-Weighted Imaging Using Readout-Segmented Echo-Planar Imaging, Parallel Imaging and a Two-Dimensional Navigator-Based Reacquisition," Porter et al., Magnetic Resonance in Medicine, vol. 62 (2009), pp. 468-475.

"Controlled Aliasing in Parallel Imaging Results in Higher Acceleration (CAIPIRINHA) for Multi-Slice Imaging," Breuer et al., Magnetic Resonance in Medicine, vol. 53 (2005), pp. 684-691.

"Generalized Autocalibrating Partially Parallel Acquisitions (GRAPPA)," Griswold et al., Magnetic Resonance in Medicine, vol. 47 (2002), pp. 1202-1210.

* cited by examiner

METHOD AND MAGNETIC RESONANCE APPARATUS TO ACQUIRE MAGNETIC RESONANCE DATA WITH A DIFFUSION-WEIGHTED MAGNETIC RESONANCE SEQUENCE

BACKGROUND OF THE INVENTION

Field of the Invention

The invention concerns a method to acquire magnetic resonance data with a diffusion-weighted magnetic resonance sequence using a magnetic resonance apparatus with a gradient coil arrangement that has three gradient coils, each designed to generate a gradient in a gradient direction, the gradient directions being orthogonal to one another. The invention also concerns a magnetic resonance apparatus to implement such a method.

Description of the Prior Art

Magnetic resonance imaging is a widely known and prevalent imaging method that is often applied in a medical context. Within the scope of a magnetic resonance sequence, nuclear spins in a subject are excited by at least one excitation pulse and the resulting magnetic resonance signals generated by the spins are acquired in a readout time period after a defined duration (what is known as the echo time). A spatial coding takes place with the use of gradients that are switched (activated) at different points in time of the magnetic resonance sequence. A differentiation is typically made between a gradient known as: the slice selection gradient that defines the slice to be excited; and the phase coding gradient (typically orthogonal to this slice selection gradient) that codes a position in a direction within the slice by the phase of the signal; and the readout gradient that allows a sweeping of the slice in a direction that is orthogonal to the phase coding gradient and the slice selection gradient. Overall, within the slice gradients produce a trajectory or path within k-space, along which data representing the signals are entered into k-space. The measured k-space data (magnetic resonance data) can be translated into the spatial domain by a Fourier transformation, so that magnetic resonance images are created. In modern magnetic resonance devices, radio-frequency coils are used to generate excitation pulses as well as for the reception of the magnetic resonance signals. For the generation of the gradient pulses a gradient coil arrangement is provided that typically has three gradient coils that each correspond to a different spatial direction in an imaging region, i.e. can generate a gradient of the magnetic field in this gradient direction. Many sequences use the z-direction as the slice selection direction, the y-direction as the phase coding direction, and the x-direction as the readout direction.

In many magnetic resonance examinations, sequences known as diffusion-weighted magnetic resonance sequences are used, particularly for magnetic resonance acquisitions of the head of a patient. Diffusion-weighted magnetic resonance sequences have also been suggested for breast examinations. Diffusion-weighted magnetic resonance sequences are characterized by additional gradient pulses (known as diffusion gradients) that can be assembled as a diffusion module, being integrated into the magnetic resonance sequence. Most often, EPI (echoplanar imaging) readout trains are combined with an upstream diffusion module. The best image results are thereby achieved when the echo times (TE) are as short as possible. For example, at clinical resolutions, a sequence known as the RESOLVE sequence thus allows echo times of approximately 60 ms. The RESOLVE sequence was proposed in an article by D. A. Porter and R. M. Heidemann, "High resolution diffusion-weighted imaging using readout-segmented echo-planar imaging, parallel imaging and a two-dimensional navigator-based reacquisition", Magn. Reson. Med. 62:468-475 (2009).

Many diffusion-weighted magnetic resonance sequences measure different slices in a target object to be acquired, which is also designated as two-dimensional magnetic resonance imaging. Techniques are often also used that allow multiple slices to be acquired simultaneously in order to reduce the repetition time (TR) and the entire acquisition time. In particular, modified radio-frequency pulses can be used in order to excite and refocus the magnetization of multiple different slices in an actually simultaneous manner. The resulting echoes then similarly arise simultaneously, wherein the superimposed individual signals of the different slices that are then sampled as a magnetic resonance signal can be divided algorithmically, for example by the use of spatially dependent information of multiple reception coils. This is an application of what is known as parallel imaging, for which one known embodiment that is often used is the GRAPPA technique, as described in the article by M. A. Griswold et al., "Generalized autocalibrating partially parallel acquisitions (GRAPPA)", Magn. Reson. Med. 47(6): 1202-1210 (2002). One extension of the fundamental idea of the simultaneous excitation and refocusing is known as the CAIPIRINHA method, as described in F. A. Breuer et al., "Controlled aliasing in parallel imaging results in higher acceleration (CAIPIRINHA) for multi-slice imaging", Magn. Reson. Med. 53:684-691 (2005). For example, it has been proposed to combine a CAIPIRINHA method using short gradient pulses ("blipped") for simultaneous imaging of multiple slices with the diffusion-weighted, readout-segmented echoplanar imaging sequence (rs-EPI—readout segmented echo planar imaging), as described in U.S. Pat. No. 7,205,763 and the aforementioned article by D. A. Porter et al.

These references also note that navigators can be used for real-time feedback. The acquisition of the navigators then forms a second partial sequence of the magnetic resonance sequence, which concurrently uses the excitation signal emitted in the first partial sequence for acquisition of the actual magnetic resonance data and uses a new refocusing pulse and a new readout time period. A navigator feedback is typically used in connection with the rs-EPI sequence or other diffusion-weighted magnetic resonance sequences in order to identify and re-measure readout segments with strong, movement-induced phase errors or other movement effects, if they cannot be reliably corrected by a correction technique (for example phase correction) under consideration of the two-dimensional navigators.

EPI sequences and a few other magnetic resonance sequences used within the scope of the diffusion-weighted imaging use sinusoidal readout gradients in the readout direction in the readout train, while short gradient pulses—known as "blips"—are switched in the phase coding direction between the readout processes. With regard to the k-space trajectory, jumps from one k-space line to another k-space line that should be read out can be made as quickly as possible via these "blips".

In such an embodiment, diffusion-weighted magnetic resonance sequences consequently place extremely high demands on the gradient coil arrangements of the magnetic resonance devices, among other things on the available slew rates (SR). In order to achieve short echo times (TE), extremely high slew rates of >175 T/m/s on a gradient axis are used, which is possible only with high-end gradient systems. Accordingly, it is extremely difficult to execute a diffusion-weighted magnetic resonance sequence supplying evaluable results at a low-end system with a weaker gradient system allowing only low slew rates. However, diffusion-weighted magnetic resonance sequences and the corresponding clinical results are also required at such magnetic resonance devices.

To solve this problem, given the use of low-end magnetic resonance devices it is known to only temporally extend the known diffusion-weighted magnetic resonance sequences so that they can be executed with the present specifications of the gradient coil arrangement. This entails a steep rise of the echo times, for example from 67 ms to 121 ms given known clinical magnetic resonance sequences. The primary cause for this extension of the echo times is that the readout train must be markedly extended due to the markedly lower slew rates.

SUMMARY OF THE INVENTION

An object of the invention is to modify diffusion-weighted magnetic resonance sequences so as to allow shorter echo times, and thus an improved image quality.

This object is achieved by a method of the aforementioned type wherein, according to the invention, the readout gradient is flipped relative to at least one of the gradient directions such that at least two gradient coils contribute to a possible slew rate of a readout gradient pulse, and such that a phase coding gradient that is constant over the readout time period is chosen.

The invention proceeds from the prevalent procedure that the slice selection direction, the phase coding direction and the readout direction—consequently the directions in which the corresponding gradients are applied—are chosen along gradient directions given known diffusion-weighted magnetic resonance sequences, for example the slice selection direction along the z-direction, the phase coding direction along the y-direction and the readout direction along the x-direction. For example, this is based on the fact that eddy currents that are unwanted can arise in high-end magnetic resonance devices, thus those that comprise a gradient system capable of extremely high loads, with high slew rates. The method according to the invention is based on the realization that this eddy current situation is less pronounced given the low-end magnetic resonance devices addressed by the invention but, due to the flipping of the readout gradient out of the gradient direction defined by the gradient coil arrangement (and thus of at least one additional gradient, preferably phase coding gradient), the readout gradient is divided into the at least two gradient directions of the gradient coil arrangement at the flipping of corresponding portions, such that the existing slew rate and amplitude can be utilized simultaneously in the at least two gradient directions so that an effectively higher slew rate (and possibly also amplitude) can be used. The second step, namely the use of a temporally constant phase coding gradient during the readout time period (thus the duration of the readout train), avoids the "blips" having extremely steep edges (and thus posing high demands), thus short gradient pulses for "jumping" between lines in k-space. Consequently, no slew rate is required by the phase coding during the readout time period. For a consideration of the k-space trajectory, this means that jumps no longer take place between individual lines in k-space via the "blips", but rather the lines ultimately travel at angles and one following another. It has been shown that such a modification of the k-space trajectory barely affects the quality of the acquired magnetic resonance data, and even the aforementioned GRAPPA algorithms can still be used in parallel imaging.

With these measures, the echo time can be markedly reduced (by approximately 15%, for example) given low-end magnetic resonance devices with which the invention primarily deals. Diffusion-weighted magnetic resonance sequences can therefore be realized with faster echo times and consequently deliver clinically more significant, higher-quality image data. Low-end magnetic resonance devices, in which the realization of the known diffusion-weighted magnetic resonance sequences can only be achieved with echo times that are too long, in part due to the specifications of the gradient system, are for example such magnetic resonance devices in which gradient coils with a maximum slew rate <150 T/m/s (in particular <50 T/m/s) are used. Such magnetic resonance devices can then consequently also be used for diffusion-weighted magnetic resonance sequences that use extremely short echo times, such that it can more generally be stated that the magnetic resonance sequence can have an echo time <500 ms, in particular <250 ms, preferably ≤100 ms.

Lines in k-space lines of the k-space trajectory often adjoin one another very closely (consequently the "blips" must produce only small jumps in the phase coding direction in k-space) given diffusion-weighted magnetic resonance sequences. A phase coding gradient replacing the "blips" according to the invention is also accordingly to be chosen to be extremely small, such that the constant phase coding gradient is in particular <0.01 mT/m, preferably ≤0.005 mT/m.

Within the scope of the present invention, it is also proposed that all spatial gradients (thus the readout gradient, the phase coding gradient and the slice selection gradient) are orthogonal to one another, such that consequently at least one additional gradient (in particular the phase coding gradient) is also flipped out of a gradient. In a preferred embodiment of the present invention, it can thus be provided that the readout gradient is flipped only in one plane defined by two gradient directions together with the phase coding gradient. For example, if it is assumed that—given a magnetic resonance sequence known in the prior art—the readout gradient lies in the x-direction and the phase coding gradient lies in the y-direction, the readout gradient would be flipped in the x/y-plane, naturally together with the phase coding gradient.

However, it is also conceivable for the readout gradient to be flipped relative to all three gradient directions so that a further increase of the effective slew rate occurs via the contribution of the third gradient direction as well. It is hereby problematic that the slice thickness is often greater than the in-plane resolution that is used in the phase coding direction and readout direction, such that inaccuracies can occur given a back-calculation from a final magnetic resonance image that to be displayed to a target orientation desired by a user.

The readout gradient is preferably flipped by at least 25°—preferably by 45°—relative to a gradient direction. While a marked gain in the effective slew rate can already be achieved given a flipping by at least 25°, the optimum is achieved given a flipping of 45°, after which a slew rate that is greater by a factor of √2 can effectively be used in a flipping in a plane of two gradient coils by utilizing the present slew rate. If a flipping is also conducted outside of the plane—in particular with regard to the slice selection direction—an increase of the slew rate by a factor of √3 can be enabled given a flip angle of 45°.

In a further embodiment of the invention, a magnetic resonance image to be displayed is determined from the magnetic resonance data so that its orientation corresponds to a target orientation with an imaginary readout gradient in a gradient direction or in a direction preselected by a user. As noted, with known diffusion-weighted magnetic resonance sequences it is typical for the readout gradient to point in a defined gradient direction, for example the x-direction. That in turn means that a user expects a magnetic resonance image in a defined orientation, which also applies if a defined, desired target orientation can be derived from inputs by the user. However, the selection of the readout gradients and the phase coding gradients—which preferably takes place automatically in the present invention—initially provides a different orientation of magnetic resonance images determined from the magnetic resonance data. It can consequently be provided that, after acquisition of the magnetic resonance data, a magnetic resonance image to be displayed is determined that is present in this target orientation and thus satisfies the expectations of the user. For example, a gridding algorithm and/or an interpolation algorithm can be used to determine the magnetic resonance image to be displayed from a magnetic resonance image that is determined from the magnetic resonance data and flipped relative to the target orientation. Corresponding methods (which can also be found under the keyword "regridding") are basically known in the prior art and pertain to the recalculation of an image on a different arrangement of pixels, consequently—concretely, as in the case provided here—on a different travel direction of the rows and columns. These known algorithms can accordingly also be used to determine the magnetic resonance image to be displayed in the target orientation.

With regard to the determination of a magnetic resonance image to be displayed from a magnetic resonance image that is derived from the magnetic resonance data and flipped relative to the target orientation, it is additionally advantageous for the magnetic resonance data to be acquired with oversampling such that a desired target region is covered entirely in the magnetic resonance image to be displayed. Via a (possibly additional) oversampling, the acquired image region is increased so that it ideally entirely includes the target region that should be covered in the magnetic resonance image to be displayed.

As mentioned, it is particularly advantageous if the selection of the direction of the readout gradient and the determination of the magnetic resonance image to be displayed take place automatically on the part of a control device, without user interaction. This means that it uses automatic processes running in the background that enable a realization of short echo times (and thus diffusion-weighted magnetic resonance sequences) even at low-end magnetic resonance devices, without a user explicitly needing to be aware of this because the user does not need to make any adjustments in this regard and receives the desired magnetic resonance image that is to be displayed in the correct target orientation. For example, whenever specific echo times should be achieved that are difficult to achieve or cannot be achieved with the known specifications of the gradient coil arrangement, the flipping of the readout gradient and the "turning back" of the magnetic resonance image to be displayed into the target orientation can thus take place automatically in the background.

For this purpose, a readout gradient that is flipped counter to a gradient direction is chosen automatically only given an echo time entered by a user that falls below a threshold dependent on the maximum allowable operating parameters of the gradient coils (in particular the maximum slew rates). Ultimately, the threshold is thus chosen with knowledge of the specifications of the gradient coil arrangement so that a check occurs as to whether the desired echo time can be realized at all with the present magnetic resonance device (in particular the gradient coil arrangement). Alternatively, it is also conceivable to leave a certain tolerance between what is theoretically possible with the gradient coil arrangement and the threshold so that, even for high loads of the gradient coil arrangement that are theoretically still possible, these are reduced in that the readout direction is flipped out of the gradient direction according to the invention. The flipping of the readout direction and the automatic determination of the magnetic resonance image to be displayed are consequently implemented using an automatic check only when this is also actually necessary. Other measurements with echo times that are easily realized by the gradient coil arrangement thus remain unchanged, and thus unaffected.

In general, the same readout direction as for the magnetic resonance data is used for navigator data to be acquired within the scope of the magnetic resonance sequence. Thus, if the magnetic resonance sequence includes a second partial sequence in which navigator data are acquired for a navigator, for example, which navigator data are relevant with regard to the assessment of the movement, for example, the flipping of the readout direction (and thus the reduction of the echo time) can also be advantageously transferred to this navigator measurement.

The method according to the invention is particularly suitable for the EPI sequences already discussed with regard to the prior art, such as a RESOLVE sequence. In general, a gain in echo time is achieved whenever a high slew rate is required, in particular thus if "blips" and/or sinusoidally traveling gradient pulses are included in the readout train.

In addition to the method, the present invention also concerns a magnetic resonance device having a gradient coil arrangement that comprises three gradient coils designed to generate a gradient in gradient directions that are orthogonal to one another, and a control device designed to implement the method according to the invention. All statements with regard to the method according to the invention apply analogously to the magnetic resonance device according to the invention so that the cited advantages can also be achieved for this. In particular, the control device is thus designed to control additional components of the magnetic resonance apparatus to acquire magnetic resonance data, and possibly to determine a magnetic resonance image to be displayed.

The present invention also encompasses a non-transitory, computer-readable data storage medium encoded with programming instructions that, when the storage medium is loaded into a computerized control device of a magnetic resonance apparatus, cause the control device to operate the magnetic resonance apparatus to implement any or all of the embodiments of the method according to the invention described above.

DESCRIPTION OF THE PREFERRED EMBODIMENTS

Figure 1:
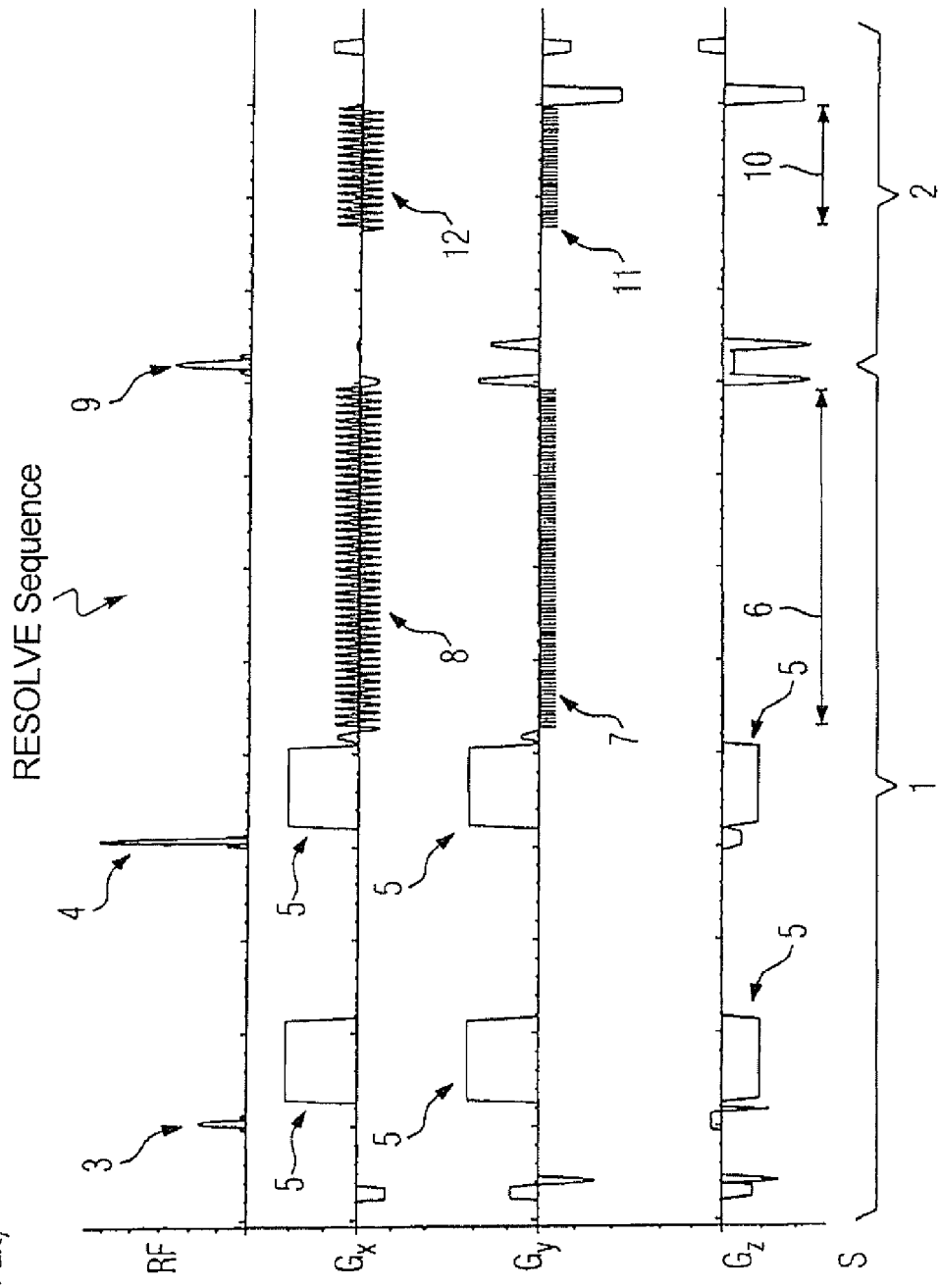
FIG. 1 shows a diffusion-weighted magnetic resonance sequence according to the prior art.

FIG. 1 shows the basic workflow of a RESOLVE magnetic resonance sequence known from the prior art for acquisition of magnetic resonance data for the diffusion-weighted imaging. The shown magnetic resonance sequence can thereby be subdivided into two partial sequences, namely a first partial sequence 1 in which the magnetic resonance data should be acquired and a second partial sequence 2 in which navigator data should be acquired in order to detect and to correct phase errors created by movement of the acquisition region, or to trigger a re-acquisition of affected readout segments in k-space.

The pulses and time window that are shown in the diagram of FIG. 1 initially relate, from top to bottom, to: the radio-frequency pulses (RF=radio-frequency); the gradient pulses $G_x$ (here the readout gradient) acting in the gradient direction x that is covered by a gradient coil; the gradient pulses $G_y$ acting in the gradient direction y that is covered by an additional gradient coil; and the gradient pulses $G_z$ acting in the gradient direction z covered by a third gradient coil of the gradient coil arrangement. In the magnetic resonance sequence of FIG. 1, the x-direction corresponds to the direction of the readout gradient; the y-direction corresponds to the direction of the phase coding gradient; and the z-direction corresponds to the direction of the slice selection gradient. S designates readout time windows for the readout of data (sampling).

In the first partial sequence 1, the shown magnetic resonance sequence first uses a radio-frequency excitation pulse 3 with a flip angle of 90°, followed by a refocusing pulse 4 with a flip angle of 180°. The gradient pulses 5 concern the diffusion gradients and the slice selection, as thus is fundamentally known.

The magnetic resonance data are acquired in the readout time period 6 of the first partial sequence 1. The distance from the excitation pulse 3 to the middle of the readout time period 6—thus the point in time at which the k-space center is measured—corresponds to the echo time TE. A gradient having extremely short successive gradient pulses 7 ("blips") is applied in the phase coding direction (here the y-direction) during the readout time period 6 in order to change between different k-space lines; in the readout direction (here the x-direction) a sinusoidal gradient pulse 8 is used in order to traverse the corresponding lines in k-space.

At the beginning of the second partial sequence 2, an additional refocusing pulse 9 is provided which is followed by a readout time period 10 for the navigator data; during the corresponding gradient pulse 11, the phase coding gradient or a corresponding gradient pulse 12 of the readout gradient are applied that, however, here cover only a smaller portion of k-space.

If, in such an example, a magnetic resonance device in the low-end range is now assumed whose gradient coil arrangement allows only a slew rate of 25 T/m/s and a maximum gradient (thus a maximum amplitude) of 20 mT/m, an extremely long echo time of 121 ms results since the diffusion-weighted RESOLVE magnetic resonance sequence (shown here as an example) must be extended in comparison to modern high-end apparatuses that enable a slew rate of 180 T/m/s and a maximum gradient amplitude of over 40 mT/m. For comparison, only an echo time of 67 ms would result given a corresponding high-end magnetic resonance device. Although the extended diffusion coding also has an influence on this extension of the readout time, the readout process must primarily be extended in order to comply with the specifications of the gradient coil arrangement of the low-end magnetic resonance device, and to not exceed a slew rate of 25 T/m/s.

The present invention is a modification of such diffusion-weighted magnetic resonance sequences in order to achieve a shorter echo time even for a low-end magnetic resonance device as it has been described above. Two measures are proposed for this. "Blips" are no longer used for the phase coding; rather, a constant phase coding gradient over the readout time period 6 is used. Also, however, the acquired slice is flipped by 45° in the slice plane, which means that the readout direction (and thus the readout gradient) and the phase coding direction (and thus the phase coding gradient) are flipped by 45° out of the gradient directions x and y. The phase coding gradient and the readout gradient distribute in equal parts to the x-direction and y-direction. Since the maximum slew rates on all physical gradient directions that are defined by the gradient coils of the gradient coil arrangement are possible independently of one another, the effective slew rate for the readout gradient (it is no longer required for the phase coding gradient) can be increased by a factor of $\sqrt{2}$. The echo time therefore decreases from 121 ms to 107 ms in the cited example.

Figure 2:
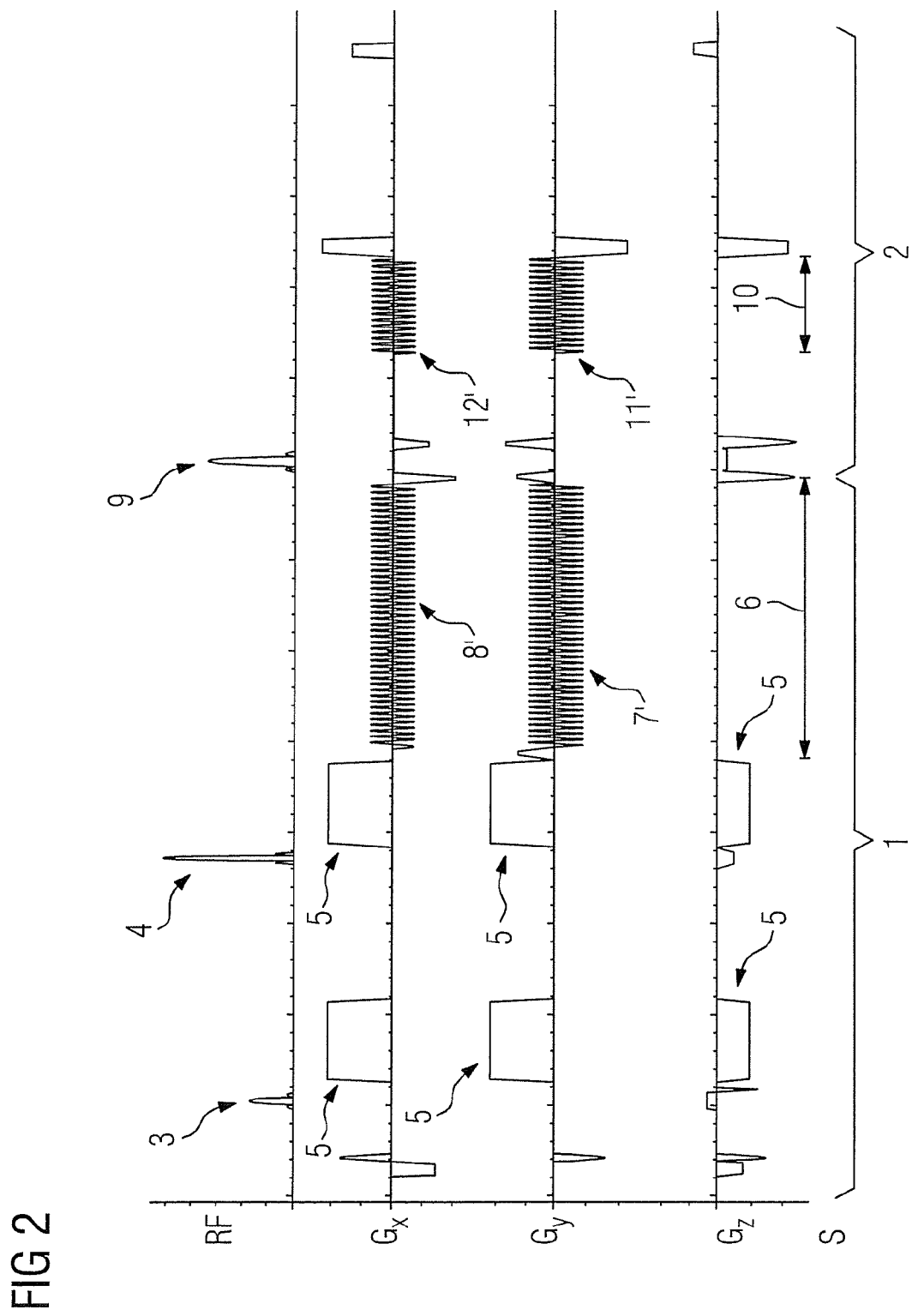
FIG. 2 shows a diffusion-weighted magnetic resonance sequence for use in the method according to the invention.

FIG. 2 shows a sequence diagram of the magnetic resonance sequence that is modified in such a manner, wherein for the sake of simplicity identical elements are provided with the same reference characters. Sinusoidal gradient pulses 7', 8', 11', 12' clearly now exist both along the x-direction and the y-direction in the readout time period 6 and in the readout time period 10, which sinusoidal gradient pulses 7', 8', 11', 12' are shifted to zero so that the constant phase coding gradient results. Because extremely small values are provided for this—for example in the range of 0.005 mT/m—these shifts are no longer apparent in FIG. 2. The specifications of the low-end magnetic resonance device (concretely of the gradient coil arrangement) are also complied with for the magnetic resonance sequence of FIG. 2.

The other gradient pulses have naturally also been adapted in the slice plane so that they correspond to the new readout direction or, respectively, phase coding direction.

Figure 3:
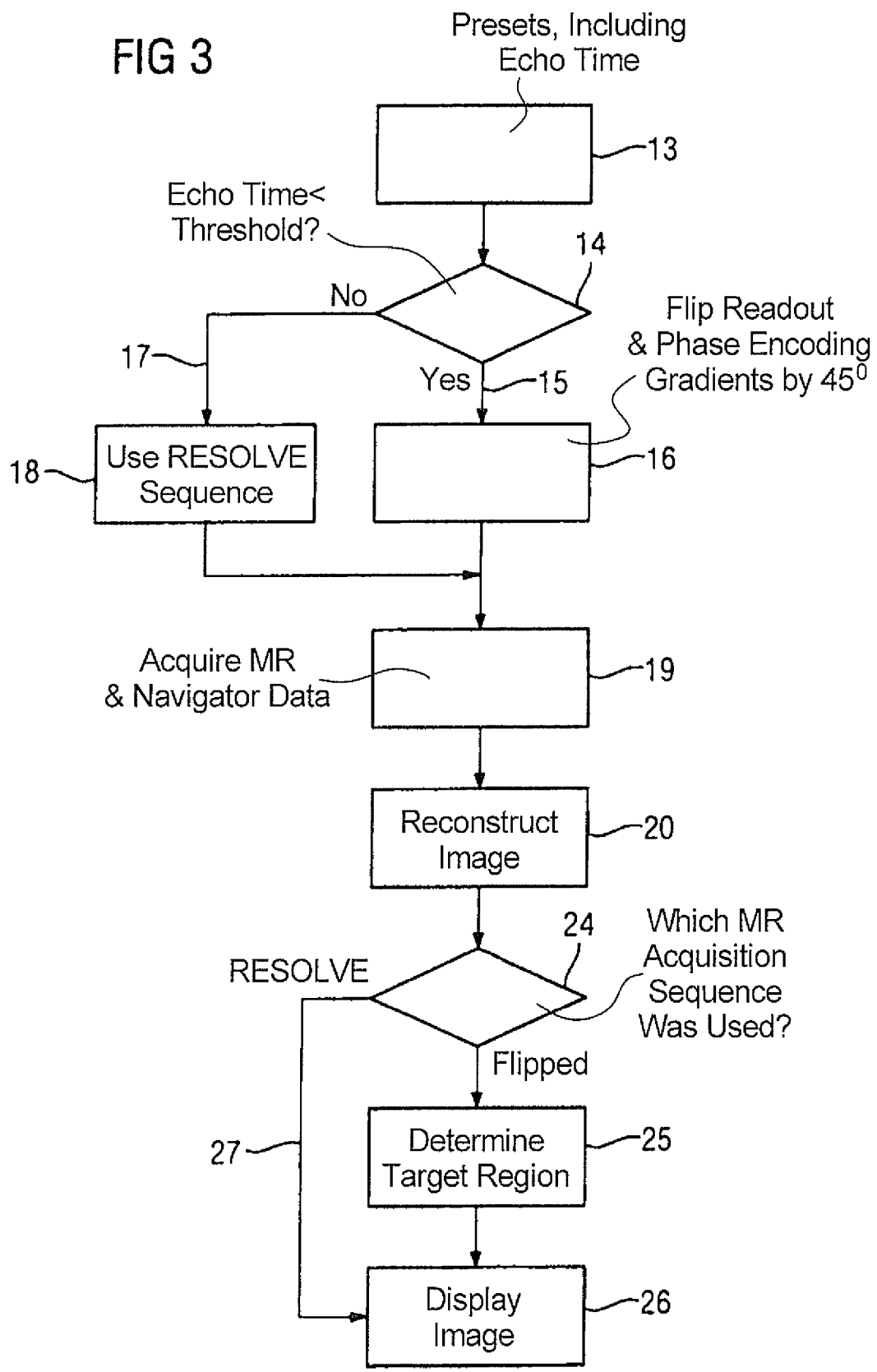
FIG. 3 is a flowchart of an embodiment of the method according to the invention.

FIG. 3 shows a workflow plan of an exemplary embodiment of the method according to the invention.

Typical presets are initially made by a user in a step 13, among which presets is also a desired echo time. Therefore, in step 14 a check is initially made as to whether the echo time falls below a threshold that is defined by the specifications of the gradient coil arrangement and ultimately indicates whether such an echo time may be realized while complying with these specifications—in particular the maximum slew rate—if the direction of the readout gradient and the direction of the phase coding gradient furthermore would correspond to gradient directions, in particular thus the x-direction or y-direction. Only if this is not the case—arrow 15—are the direction of the readout gradient and the direction of the phase coding gradient flipped by 45° in the slice plane that they define, as this was already described. In addition to this, the modified magnetic resonance sequence is then selected in step 16 according to FIG. 2.

If, in contrast to this, the echo time can also be achieved within the specifications of the gradient coil arrangement (arrow 17), in step 18 the typical magnetic resonance sequence of the prior art (thus according to FIG. 1, for example) is chosen, and the x-direction is chosen as a readout direction and the y-direction is chosen as a phase coding direction.

In step 19, the acquisition of the magnetic resonance data and the navigator data of the second partial sequence then takes place using the respective selected magnetic resonance sequences and directions. Thanks to the flipping (step 16), shorter echo times can be achieved than would actually be possible according to the specifications.

Moreover, the modified magnetic resonance sequence of FIG. 2 is thereby designed so that a larger imaging region is acquired, which means that an oversampling occurs in comparison to the magnetic resonance sequence of FIG. 1, which should be explained now.

Figure 4:
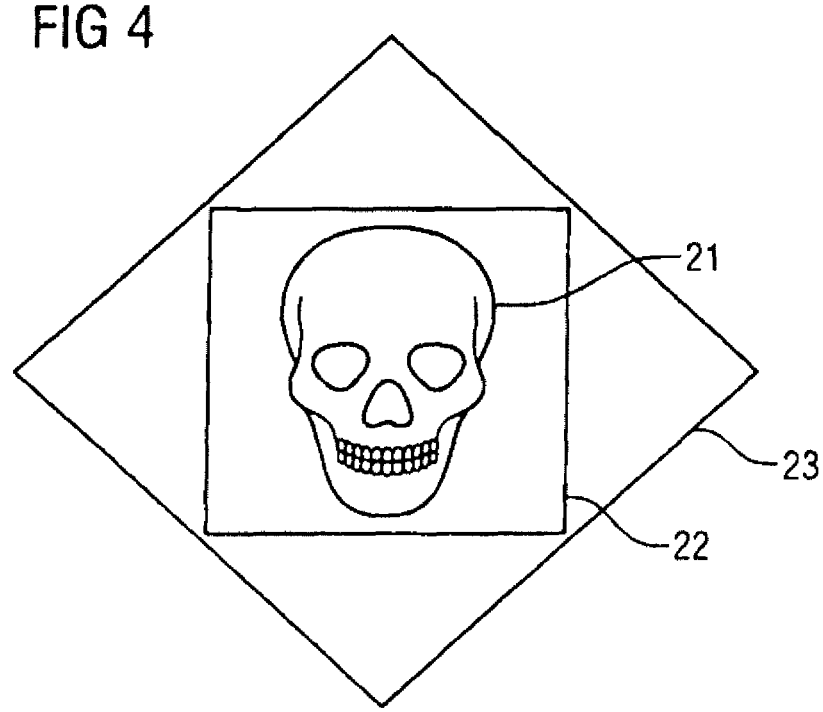
FIG. 4 is a diagram of the determination of a magnetic resonance image to be displayed.

If a magnetic resonance image is reconstructed from the acquired magnetic resonance data in step 20, due to the modified direction of the readout gradient and the phase coding gradient a magnetic resonance image acquired using the modified magnetic resonance sequence of FIG. 2 is inevitably flipped relative to a magnetic resonance image acquired with the conventional magnetic resonance sequence of FIG. 1, as this is explained in detail via FIG. 4.

In the example of a target object 21 (here a skull), FIG. 4 shows the orientation and coverage of a magnetic resonance image 22 reconstructed from magnetic resonance data acquired with the magnetic resonance sequence of FIG. 1, in which magnetic resonance image 22 the readout direction lies in the x-direction and the phase coding direction lies in the y-direction. The magnetic resonance image 22 clearly encompasses the entire target region including the target object 21 and has a defined orientation expected by the user.

Due to the oversampling, a magnetic resonance image 23 covering a larger region and flipped relative to the magnetic resonance image 22 results given the reconstruction of a magnetic resonance image from magnetic resonance data acquired with the magnetic resonance sequence of FIG. 2, which magnetic resonance image 23 has a different orientation due to the oversampling but nevertheless includes the entire target region (marked by the magnetic resonance image 22). Like the readout direction, the magnetic resonance image 23 is also flipped by 45° relative to the magnetic resonance image 22. If the flipped magnetic resonance image 23 were now displayed, an unwanted and unexpected situation would occur for the user, such that—according to the method according to the invention (see FIG. 3)—a check is made in step 24 as to whether the magnetic resonance sequence with flipped readout direction was used, such that if necessary a magnetic resonance image to be displayed in the desired target orientation of the magnetic resonance image 22 that shows the target region can be determined from the flipped magnetic resonance image 23 in step 25. This thus means that a magnetic resonance image defined by the limits of the magnetic resonance image 22 and to be displayed oriented like the magnetic resonance image 22 is determined from the flipped magnetic resonance image 23, wherein known gridding and/or interpolation algorithms can be used. If a conventional magnetic resonance sequence according to FIG. 1 has been used, the magnetic resonance image 22 determined in step 20 can be used for display and further use (see arrow 27). The display of the magnetic resonance images can then take place in step 26. Because the determination of the magnetic resonance image to be displayed also takes place entirely automatically in step 25, the corresponding processes are thus hidden to a user as they run, which means that no user interaction is required for this that could complicate the acquisition process.

It is noted that cases are also conceivable in which a different desired target orientation is predetermined in principle by a user, which can then be realized for the use of both sequences.

Figure 5:
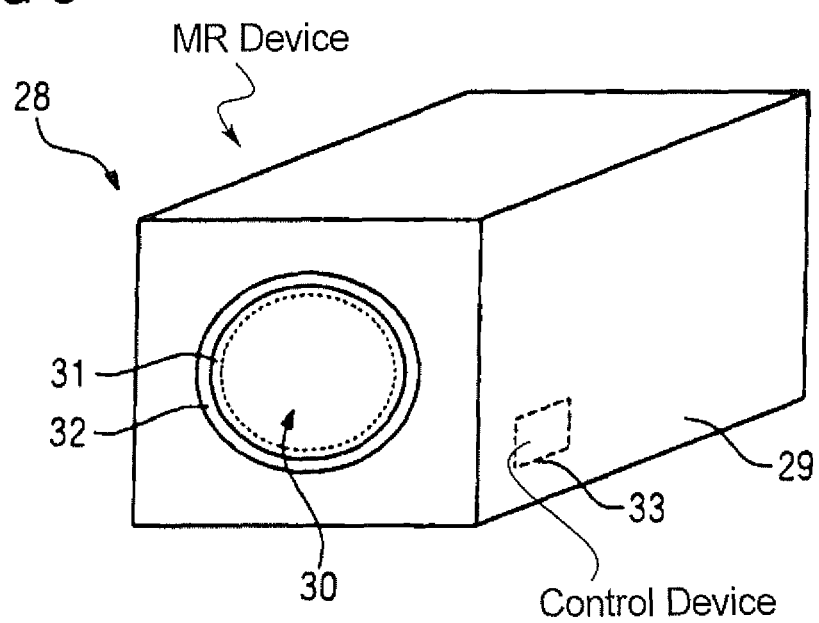
FIG. 5 schematically illustrates a magnetic resonance device according to the invention.

FIG. 5 finally shows a principle drawing of a magnetic resonance device 28 according to the invention that, as is known in principle, has a basic magnet unit 29 that defines a patient receptacle 30 into which a patient bed (not shown in detail) can be introduced. As is known in principle, the patient receptacle 30 is surrounded by a radio-frequency coil arrangement 31 and a gradient coil arrangement 32 that presently has three gradient coils that here are not shown in detail. Each gradient coil is designed to generate a magnetic field gradient in one of three gradient directions orthogonal to one another. The operation of the magnetic resonance device 28 is controlled by a control device 33 that is designed to implement the method according to the invention, in particular thus the method according to FIG. 3.

For this, the control device 33 can comprise a sequence control unit via which magnetic resonance sequences like the magnetic resonance sequence shown in FIG. 1 and FIG. 2 can be realized in that suitable components are controlled. Additional conceivable function units of such a control device 33 are: a reconstruction unit to determine magnetic resonance images from acquired magnetic resonance data in which the determination of a magnetic resonance image to be displayed can also take place from a flipped image; and a checking unit that selects the corresponding magnetic resonance sequence to be used.

A control program, in the form of programming instructions encoded on a non-transitory, computer-readable data storage medium, is executed by the control device 33, when the storage medium is loaded into the control device 33. The programming instructions cause the control device 33 to operate the magnetic resonance apparatus 28 (i.e., a magnetic resonance data acquisition unit) in order to implement any or all of the embodiments of the method according to the invention, as described above.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to acquired magnetic resonance (MR) data comprising:

operating an MR data acquisition unit, in which an examination subject is situated, to execute a diffusion-weighted magnetic resonance data acquisition sequence, said MR data acquisition unit comprising a gradient coil arrangement comprising three gradient coils that each generate a gradient magnetic field in a gradient direction, the respective gradient directions being orthogonal to each other;

in said diffusion-weighted magnetic resonance data acquisition sequence, operating said gradient coil arrangement to generate a readout gradient during a readout time period, said readout gradient having a slew rate, and to flip said readout gradient relative to at least one of said gradient directions to cause at least two of said gradient coils to each contribute to the slew rate of the readout gradient pulse, and to thereby generate, from said contributions, a phase coding gradient that is constant over said readout time period; and via a processor, storing the MR data acquired with said diffusion-weighted magnetic resonance data acquisition sequence in an electronic memory as a data file, and making said data file available in electronic form at an output of said processor in a format for conversion into an MR image of the examination subject.

2. A method as claimed in claim 1 comprising, in said diffusion-weighted MR data acquisition sequence, operating said MR data acquisition unit to flip said readout gradient together with said phase coding gradient, only in a plane defined by two of said gradient directions.

3. A method as claimed in claim 1 comprising, in said diffusion-weighted MR data acquisition sequence, operating said MR data acquisition device to flip said readout gradient with respect to all three of said gradient directions.

4. A method as claimed in claim 1 comprising, in said diffusion-weighted MR data acquisition sequence, operating said MR data acquisition unit to flip said readout gradient by at least 25° relative to said at least one of the gradient directions.

5. A method as claimed in claim 1 comprising, in said diffusion-weighted MR data acquisition sequence, operating said MR data acquisition unit to flip said readout gradient by at least 45° relative to said at least one of the gradient directions.

6. A method as claimed in claim 1 comprising operating said MR data acquisition unit with an EPI sequence as said diffusion-weighted MR data acquisition sequence, modified by said phase coding gradient being constant over said readout time.

7. A method as claimed in claim 1 comprising operating said MR data acquisition unit with a RESOLVE sequence as said diffusion-weighted MR data acquisition sequence, modified by said phase coding gradient being constant over said readout time.

8. A method as claimed in claim 1 comprising:
in a computer, generating said MR image of the examination subject from said data file, and displaying the MR image with an orientation corresponding to a target orientation in a direction selected from the group consisting of one of said gradient directions, and a direction selected by an input made into said computer by a user.

9. A method as claimed in claim 8 comprising generating said MR image using an algorithm selected from the group consisting of a gridding algorithm and an interpolation algorithm that operates on said data file.

10. A method as claimed in claim 1 comprising operating said MR data acquisition unit with said diffusion-weighted MR data acquisition sequence to acquire said MR data with oversampling that causes a predetermined target region in said MR image to be completely covered.

11. A method as claimed in claim 8 comprising automatically selecting said direction of said readout gradient and the orientation of the displayed MR image in said computer.

12. A method as claimed in claim 11 comprising, in said control unit, automatically selecting a readout gradient that is flipped opposite to a readout direction upon entry by a user into said control unit of an echo time that is below a threshold set dependent on maximum permissible operating parameters of said gradient coils.

13. A method as claimed in claim 12 wherein said maximum allowable operating parameters of said gradient coils include a maximum of said slew rate.

14. A method as claimed in claim 1 comprising operating said MR data acquisition unit to acquire navigator data from the examination subject in the same readout direction as in said diffusion-weighted MR data acquisition sequence.

15. A method as claimed in claim 1 comprising operating said MR data acquisition unit with said diffusion-weighted MR data acquisition sequence to produce an echo time, for acquiring said MR data, that is less than 500 ms.

16. A method as claimed in claim 1 comprising operating said MR data acquisition unit with said diffusion-weighted MR data acquisition sequence to produce an echo time, for acquiring said MR data, that is less than 250 ms.

17. A method as claimed in claim 1 comprising operating said MR data acquisition unit with said diffusion-weighted MR data acquisition sequence to cause said slew rate to not exceed a maximum of 150 T/m/s.

18. A method as claimed in claim 1 comprising operating said MR data acquisition unit with said diffusion-weighted MR data acquisition sequence to cause said slew rate to not exceed a maximum of 50 T/m/s.

19. A magnetic resonance (MR) apparatus, comprising:
an MR data acquisition unit in which an examination subject is situated, said MR data acquisition unit having a gradient coil arrangement comprising three gradient coils;
a control unit configured to operate said MR data acquisition unit to execute a diffusion-weighted magnetic resonance data acquisition sequence, in which said gradient coil arrangement is operated to cause three gradient coils to each generate a gradient magnetic field in a gradient direction, the respective gradient directions being orthogonal to each other;
said control unit being configured to operate said gradient coil arrangement in said diffusion-weighted magnetic resonance data acquisition sequence, to generate a readout gradient during a readout time period, said readout gradient having a slew rate, and to flip said readout gradient relative to at least one of said gradient directions to cause at least two of said gradient coils to each contribute to the slew rate of the readout gradient pulse, and to thereby generate, from said contributions, a phase coding gradient that is constant over said readout time period; and
a processor configured to store the MR data acquired with said diffusion-weighted magnetic resonance data acquisition sequence in an electronic memory as a data file, and to make said data file available in electronic form at an output of said processor in a format for conversion into an MR image of the examination subject.

20. A non-transitory, computer-readable data storage medium encoded with programming instructions, said storage medium being loaded into a computerized control unit of a magnetic resonance (MR) apparatus, that comprises an MR data acquisition unit having a gradient coil arrangement comprising three gradient coils, said programming instructions causing said control unit to:
operate the MR data acquisition unit with an examination subject situated therein, to execute a diffusion-weighted magnetic resonance data acquisition sequence, said gradient coil arrangement is operated to cause said three gradient coils to each generate a gradient magnetic field in a gradient direction, the respective gradient directions being orthogonal to each other;
in said diffusion-weighted magnetic resonance data acquisition sequence, operate said gradient coil arrangement to generate a readout gradient during a readout time period, said readout gradient having a slew rate, and to flip said readout gradient relative to at least one of said gradient directions to cause at least two of said gradient coils to each contribute to the slew rate of the readout gradient pulse, and to thereby generate, from said contributions, a phase coding gradient that is constant over said readout time period; and store the MR data acquired with said diffusion-weighted magnetic resonance data acquisition sequence in an electronic memory as a data file, and make said data file available in electronic form at an output of said processor in a format for conversion into an MR image of the examination subject.

\* \* \* \* \*